(12) United States Patent
Benhase et al.

(10) Patent No.: US 9,323,687 B2
(45) Date of Patent: Apr. 26, 2016

(54) USE OF DIFFERING GRANULARITY HEAT MAPS FOR CACHING AND MIGRATION

(71) Applicant: INTERNATIONAL BUSINESS MACHINES CORPORATION, Armonk, NY (US)

(72) Inventors: Michael T. Benhase, Tucson, AZ (US); Lokesh M. Gupta, Tucson, AZ (US); Cheng-Chung Song, Tucson, AZ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 190 days.

(21) Appl. No.: 14/074,015

(22) Filed: Nov. 7, 2013

(65) Prior Publication Data

US 2014/0208020 A1 Jul. 24, 2014

Related U.S. Application Data

(63) Continuation of application No. 13/746,857, filed on Jan. 22, 2013.

(51) Int. Cl.
*G06F 12/10* (2006.01)
*G06F 12/08* (2016.01)
*G06F 12/02* (2006.01)
*G06F 3/06* (2006.01)
*G11C 16/10* (2006.01)

(52) U.S. Cl.
CPC .......... *G06F 12/0897* (2013.01); *G06F 3/0613* (2013.01); *G06F 3/0647* (2013.01); *G06F 3/0685* (2013.01); *G06F 12/0246* (2013.01); *G06F 12/0802* (2013.01); *G06F 12/0866* (2013.01); *G06F 2212/1024* (2013.01); *G06F 2212/222* (2013.01); *G11C 16/102* (2013.01)

(58) Field of Classification Search
CPC ............ G06F 12/0246; G06F 12/0802; G06F 12/0866; G11C 16/102
See application file for complete search history.

(56) References Cited

U.S. PATENT DOCUMENTS

| 7,693,880 | B1 | 4/2010 | Ranade |
| 8,615,678 | B1 * | 12/2013 | Madnani ............. G06F 11/1666 714/47.1 |
| 2007/0055836 | A1 | 3/2007 | Yamato et al. |
| 2010/0235582 | A1 | 9/2010 | Factor et al. |
| 2011/0010514 | A1 | 1/2011 | Benhase et al. |
| 2011/0035548 | A1 | 2/2011 | Kimmel et al. |
| 2011/0087837 | A1 | 4/2011 | Blinick et al. |
| 2012/0023282 | A1 | 1/2012 | Rub |
| 2012/0059994 | A1 | 3/2012 | Montgomery et al. |
| 2012/0102350 | A1 | 4/2012 | Belluomini et al. |

* cited by examiner

*Primary Examiner* — Jae Yu
(74) *Attorney, Agent, or Firm* — Griffiths & Seaton PLLC

(57) ABSTRACT

For data processing in a computing storage environment by a processor device, the computing storage environment incorporating at least high-speed and lower-speed caches, and tiered levels of storage, groups of data segments are migrated between the tiered levels of storage such that uniformly hot ones of the groups of data segments are migrated to utilize a Solid State Drive (SSD) portion of the tiered levels of storage, while sparsely hot ones of the groups of data segments are migrated to utilize the lower-speed cache.

7 Claims, 5 Drawing Sheets

USE OF DIFFERING GRANULARITY HEAT MAPS FOR CACHING AND MIGRATION

CROSS REFERENCE TO RELATED APPLICATIONS

This application is a Continuation of U.S. patent application Ser. No. 13/746,857, filed on Jan. 22, 2013.

FIELD OF THE INVENTION

The present invention relates generally to computers, and more particularly, to mechanisms for caching and migrating data segments in a computing storage environment.

DESCRIPTION OF THE RELATED ART

In today's society, computer systems are commonplace. Computer systems may be In the field of computing, a "cache" typically refers to a small, fast memory or storage device used to store data or instructions that were accessed recently, are accessed frequently, or are likely to be accessed in the future. Reading from or writing to a cache is typically cheaper (in terms of access time and/or resource utilization) than accessing other memory or storage devices. Once data is stored in cache, it can be accessed in cache instead of re-fetching and/or re-computing the data, saving both time and resources.

SUMMARY OF THE DESCRIBED EMBODIMENTS

Caches may be provided as multi-level caches. For example, a caching system may include both a "primary" and "secondary" cache. When reading data, a computing system or device may first look for data in the primary cache and, if the data is absent, look for the data in the secondary cache. If the data is not in either cache, the computing system or device may retrieve the data from disk drives or other storage devices. When writing data, a computing system or device may write data to the primary cache. This data may eventually be destaged to the secondary cache or a storage device to make room in the primary cache.

Storage environments in computer systems may include so-called tiered storage architectures, which may include a variety of storage mediums such as enterprise hard disk drives (HDD), serial advanced technology attachment (SATA) disk drives, solid state drives (SSD), tape drives, and other devices. Data may be migrated between such devices. Placement of certain kinds of data in the appropriate medium may greatly enhance overall performance of the storage environment.

In such tiered storage architectures, an improvement may be implemented such that certain data segments may be migrated using the tiered storage mechanisms, while others may utilize the secondary cache, or vice versa, or both. In this manner, the overall performance of the storage environment may be further enhanced.

In such tiered storage architectures making use of the aforementioned "hybrid" migration and caching mechanisms, a need arises for an effective means for determining which portion of the storage environment performs caching and migration operations on what kinds of data segments for optimal performance.

Accordingly, and in view of the foregoing, various exemplary method, system, and computer program product embodiments for data processing in a computing storage environment by a processor device, the computing storage environment incorporating at least high-speed and lower-speed caches, and tiered levels of storage, are provided. In one embodiment, by way of example only, groups of data segments are migrated between the tiered levels of storage such that uniformly hot ones of the groups of data segments are migrated to utilize a Solid State Drive (SSD) portion of the tiered levels of storage, while sparsely hot ones of the groups of data segments are migrated to utilize the lower-speed cache.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF CERTAIN EMBODIMENTS

In one exemplary tiered storage environment, migration of data segments may typically be operational on a large granularity. To this end, large (e.g., 1 GigaByte (GB)) blocks of data are migrated, based at least partly on statistics gathered over large intervals. In such a tiered system, a data segment may be migrated if the extent is determined to be "hot" (e.g., a large number of hits due to reads or writes to the data segment).

Alternatively, in contrast to large granularity operations conducted by tiered mechanisms, the secondary cache or "Flash Cache" may operate on data segments in a smaller granularity (e.g., a track of 64 KiloBytes (KB)), and caches tracks on flash memory when the tracks are demoted from the primary (i.e., Dynamic Read Only Memory (DRAM)) cache.

For data that is determined to be "hot," a need exists for a determination mechanism whereby data segments are optimally moved between tiered storage mechanisms (i.e., SSD, HDD, tape), and Flash Cache.

As previously mentioned, the illustrated embodiments provide mechanisms for using heat maps acting on differing granularity to provide a determination vehicle for migration and caching of data segments in a computing storage environment to provide optimal performance as will be further described. Data segments are examined in this heat map context to determine whether they are "uniformly" or "sparsely" hot as will be further illustrated. Differing caching and migration mechanisms are then applied to those data segments determined to be uniformly hot and those determined to be sparsely hot.

Figure 1:
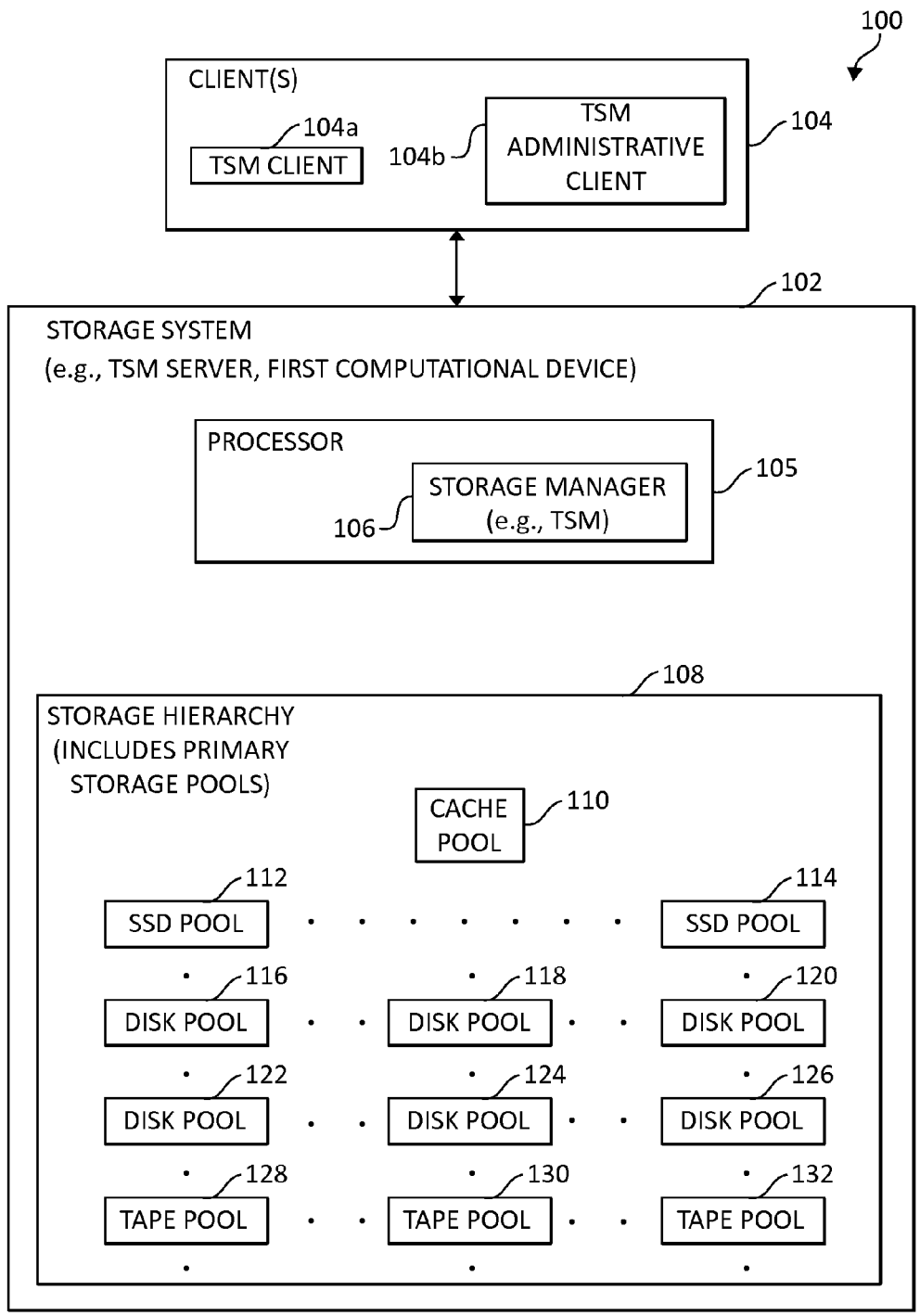
FIG. 1 is a high-level block diagram showing an exemplary tiered storage environment in which mechanisms in accordance with the present invention may be implemented.

Turning now to FIG. 1, a block diagram of a tiered computing storage environment 100 in accordance with certain embodiments is illustrated. The computing storage environment 100 includes a first computational device, such as, a storage system 102, coupled to one or more computational devices, such as, clients 104. In certain embodiments, the storage system 102 and the clients 104 may comprise any suitable computational device, including those presently known in the art, such as, a personal computer, a workstation, a mainframe, a midrange computer, a network appliance, a palm top computer, a telephony device, a blade computer, a hand held computer, etc.

In some embodiments, a storage manager 106, such as, the Tivoli® Storage Manager® (TSM) product marketed by International Business Machines (IBM®)) Corporation, may be used for securely storing and managing data segments according to aspects of the present invention. The storage manager 106 may execute in a storage management server, such as a TSM server 102 or elsewhere. In one embodiment, the storage manager is operable by and/or in conjunction with processor device 105 as shown. One of ordinary skill in the art will appreciate that various other configurations of the processor 105, storage manager 106, and related additional processing and/or memory components are contemplated. IBM, Tivoli, and Tivoli Storage Manager are trademarks or registered trademarks of IBM Corporation.

The TSM may provide data storage services to clients, such as TSM clients 104a, for management of data. The TSM server 102 may store files sent to the TSM server 102 by one or more TSM clients 104a, 104b. The storage manager 106 and/or processor device 105 may allow a system administrator to configure storage pools, where a storage pool comprises a group of devices used for storing data received from the TSM clients 104a, 104b. Storage pools are used as targets for store operations from the TSM clients 104a, 104b, and are referenced in TSM server policies and other constructs for processing.

As shown, a variety of storage devices may be organized into a storage hierarchy. Storage media within the storage hierarchy may thus be grouped into data structures referred to herein as storage pools. The storage hierarchy may be organized to correspond with one or more metrics, such as a performance metric including write or read speeds. The storage hierarchy 108 as shown may be organized such that the top of the hierarchy may include a cache pool 110 having a highest amount or quality of a particular performance metric. Below the cache pool 110, a number of solid state drive (SSD) class devices may be organized into SSD pools by the same, similar, or other metrics (e.g., SSD pools 112 and 114).

In accordance with the mechanisms of the illustrated embodiments, the particular performance metric may be tied to so-called "heat maps" (not shown for purposes of convenience) that indicate whether data segments in small, medium, or large granularities are a certain characteristic as will be further described. In one embodiment, this characteristic may be termed "uniformly hot," or "sparsely hot," again as will be further described.

Below the SSD pools 112 and 114, a first tier of disk pools (e.g., disk pools 116, 118, and 120) may be then organized. As one of ordinary skill in the art will appreciate, disk pools 116, 118, and 120 may include a variety of disk devices such as pools of enterprise disk drives, SATA disk drives, disk devices configured in a particular redundant array of independent disks (RAID) configuration, and the like.

The first tier of disk pools may be located above a second tier of disk pools (e.g., pools 122, 124, and 126) by virtue of exhibiting a greater amount, stronger attribute or attributes, or quality of the performance metric. Below the second tier of disk pools, an additional tier of tape pools (e.g., tape pools 128, 130, and 132) may then be organized. Various considerations for the organization of such storage hierarchies 108 may be apparent to one of ordinary skill in the art. In one embodiment, the system administrator may assist in performing such configurations in the storage hierarchy 108 by inputs to the TSM administrative client 104b or another mechanism. While tape pools 128, 130, and 132 are shown within the storage hierarchy 108 as shown, it should be noted that generally such tape pools are found in a storage subsystem external to those pools ranking higher in the hierarchy.

Figure 2:
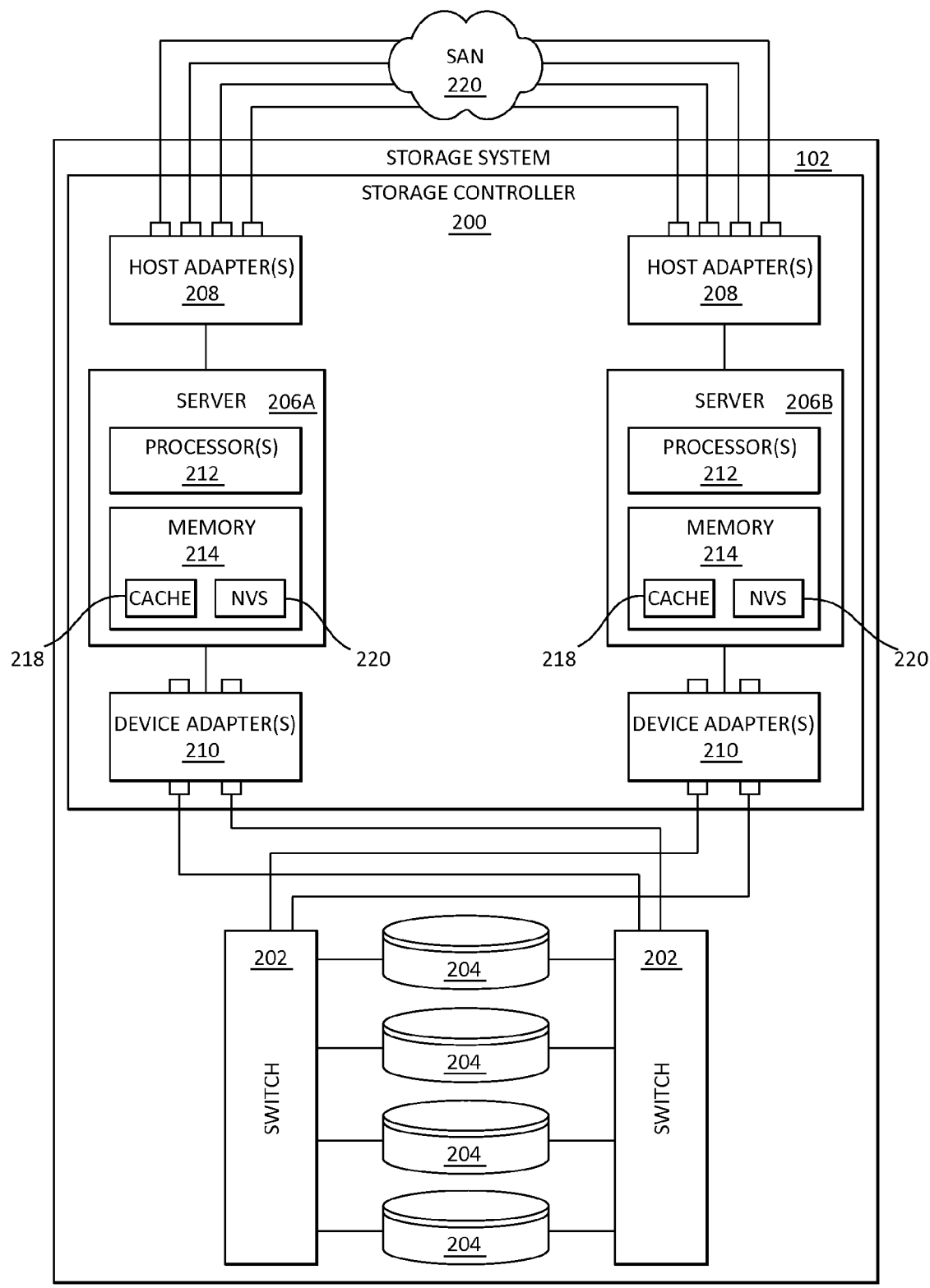
FIG. 2 is a high-level block diagram showing an exemplary storage system in which mechanisms in accordance with the present invention may be implemented.

Referring to FIG. 2, one embodiment of a storage system 102 containing an array of hard-disk drives 204 and/or solid-state drives 204 is illustrated. The internal components of the storage system 102 are shown since the caching system may, in certain embodiments, be implemented within such a storage system 102, although the caching system may also be applicable to other storage systems 102. As shown, the storage system 102 includes a storage controller 200, one or more switches 202, and one or more storage devices 204 such as hard disk drives 204 or solid-state drives 204 (such as flash-memory-based drives 204). The storage controller 200 may enable one or more clients 104 (e.g., open system and/or mainframe servers 104) to access data in the one or more storage devices 204. The clients 104 (e.g., FIG. 1) may be accessible through a Storage Area Network (SAN) 220 as shown.

In selected embodiments, the storage controller 200 includes one or more servers 206. The storage controller 200 may also include host adapters 208 and device adapters 210 to connect the storage controller 200 to host devices 106 and storage devices 203, 204, respectively. Multiple servers 206a, 206b may provide redundancy to ensure that data is always available to connected hosts 106. Thus, when one server 206a fails, the other server 206b may remain functional to ensure that I/O is able to continue between the clients 104 and the storage devices 204. This process may be referred to as a "failover."

One example of a storage system 102 having an architecture similar to that illustrated in FIG. 2 is the IBM® DS8000™ enterprise storage system. The DS8000™ is a high-performance, high-capacity storage controller providing disk storage that is designed to support continuous operations. The D8000™ series models may use IBM's POWER5™ servers 206a, 206b, which may be integrated with IBM's virtualization engine technology. Nevertheless, the caching system disclosed herein is not limited to the IBM® DS8000™ enterprise storage system, but may be implemented in any comparable or analogous storage system 110, regardless of the manufacturer, product name, or components or component names associated with the system 110.

Furthermore, any system that could benefit from one or more embodiments of the invention is deemed to fall within the scope of the invention. Thus, the IBM® DS8000™ is presented only by way of example and is not intended to be limiting.

In selected embodiments, each server 206 may include one or more processors 212 (e.g., n-way symmetric multiprocessors) and memory 214. The memory 214 may include volatile memory (e.g., RAM) as well as non-volatile memory (e.g., ROM, EPROM, EEPROM, hard disks, flash memory, etc.). The volatile memory and non-volatile memory may, in certain embodiments, store software modules that run on the processor(s) 212 and are used to access data in the storage devices 204. The servers 206 may host at least one instance of these software modules. These software modules may manage all read and write requests to logical volumes in the storage devices 204.

In selected embodiments, the memory 214 may include a cache 218. Whenever a client 104 (e.g., an open system or mainframe server 104) performs a read operation, the server 206 that performs the read may fetch data from the storages devices 204 and save it in its cache 218 in the event it is required again. If the data is requested again by a client 104, the server 206 may fetch the data from the cache 218 instead of fetching it from the storage devices 204, saving both time and resources. Similarly, when a client 104 performs a write, the server 106 that receives the write request may store the write in its cache 218, and destage the write to the storage devices 204 at a later time. When a write is stored in cache 218, the write may also be stored in non-volatile storage (NVS) 220 of the opposite server 206 so that the write can be recovered by the opposite server 206 in the event the first server 206 fails.

Figure 3:
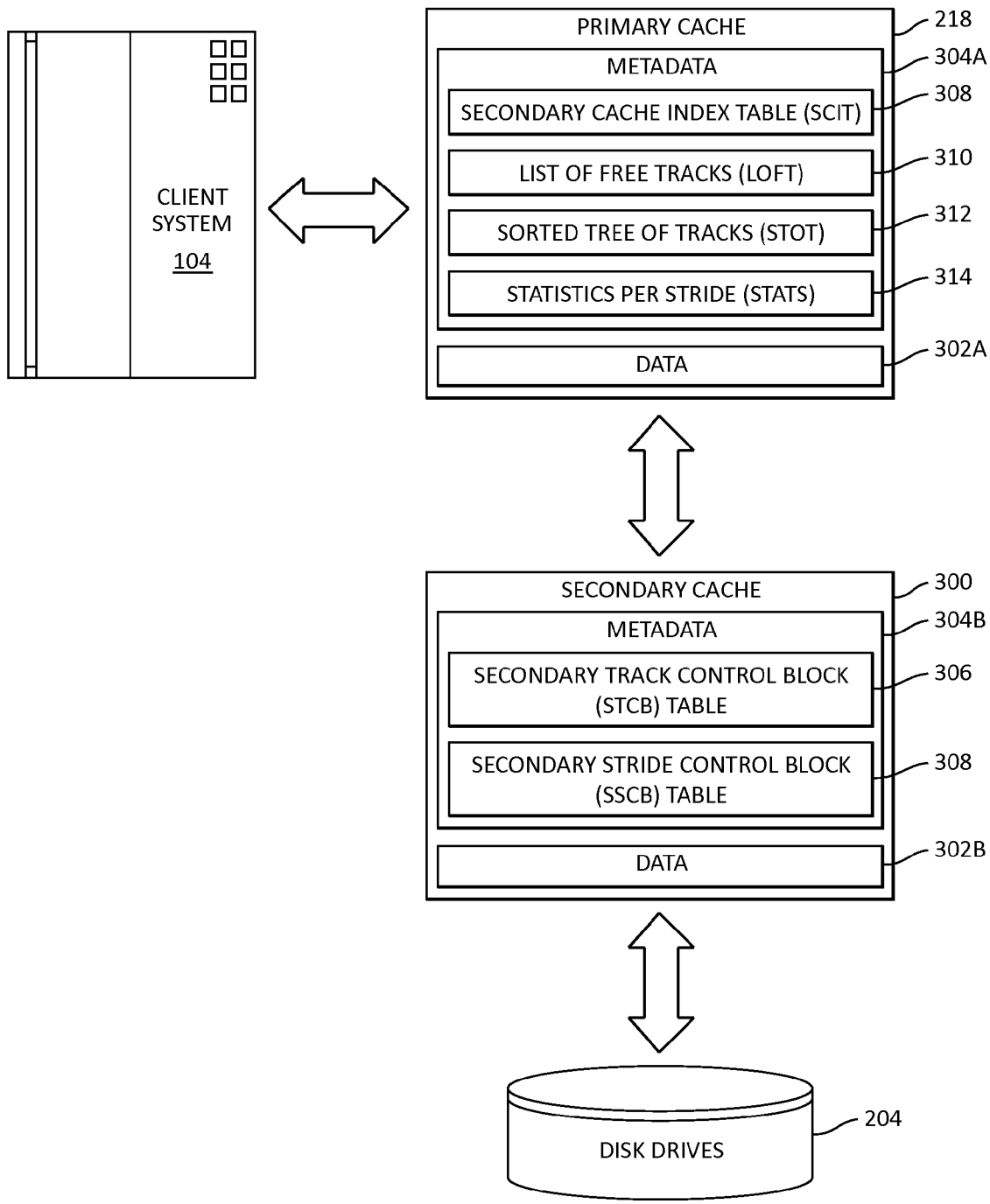
FIG. 3 is a high-level block diagram showing one embodiment of a multi-level cache in accordance with the invention.

Referring to FIG. 3, while continuing to refer generally to FIG. 2, as previously mentioned, a storage system 102 may include both hard disk drives 204 and solid-state drives (SSDs) 204, such as flash-memory-based drives 204. The I/O performance of SSDs 204 or other types of solid-state memory is typically far higher than the I/O performance of hard disk drives 204. Because of the higher I/O performance, the solid-state drives 204 may, in certain embodiments, be used to provide a large secondary cache 300 between the primary cache 218 and the hard disk drives 204. This large secondary cache 300 may significantly improve the I/O performance of the storage system 102, and may be referred to herein as "Flash Cache." Herein, the primary cache may be referred to as a high-speed or higher-speed cache (as it typically has access to the fastest Dynamic Read Only Memory or DRAM architectures), and the secondary, Flash Cache may be referred to as a low-speed or lower speed cache (in comparison to the primary, DRAM cache), although this terminology is not intended to be limiting in any way.

Using the secondary cache 300, if a read request is received by a server 206 (e.g., FIG. 2), the server 206 may initially look for data in the primary cache 218 and, if the data is not present, look for the data in the secondary cache 300 (residing in the solid-state drives 204). If the data is not available in either cache, the server 206 may retrieve the data from the disk drives 204. Similarly, when writing data, a server 206 may initially write the modified data to the primary cache 218. This modified data may eventually be destaged to the secondary cache 300 to make room in the primary cache 218. This data may then be destaged to the disk drives 204 to make space in the secondary cache 300, as needed.

In certain embodiments, the secondary cache 300 may be sized to provide about one to twenty percent, or in other embodiments about five percent of the total storage capacity of the storage system 102. Thus, for a storage system 102 that contains about ten terabytes (TB) of storage (from both hard disk drives 204 and solid state drives 204), about 0.5 TB of this storage space may be used as a secondary, "Flash" cache 300. Such a large amount of secondary cache 300 may allow data to be destaged from the secondary cache 300 far less frequently than conventional primary or secondary caches. As an example, a very large secondary cache 300 could store writes for an entire day without having to destage the writes to the disk drives 204. The writes could then be destaged at night or during a period of relative inactivity. Cache management algorithms may be redesigned to efficiently utilize the additional space in the secondary cache 300 and take advantage of the performance improvements that are possible using a large secondary cache 300.

As shown in FIG. 3, each cache 218, 300 may store data 302a, 302b and metadata 304a, 304b. The data 302a, 302b may be stored in the form of tracks. Each track in the secondary cache 300 may have a secondary track control block (STCB) associated therewith. The STCB may also be referred to herein as Cache Flash Control Block (CFCB). Along with other information, the STCB for each track may include a pointer to the next track in the chain, information indicating whether the track is free or in-use, as well as information indicating which sectors in the track have been modified. In certain embodiments, the STCBs for all the tracks may be stored in an STCB table 306 stored in the secondary cache 300 as shown, or elsewhere.

In addition, each track in the secondary cache 300 may have a secondary stride control block (SSCB) associated therewith. The SSCB, like the STCB may include diagnostic and/or statistical information, but instead relating to strides (groups of tracks) stored in the secondary cache 300. The SSCB may also be referred to herein as Cache Flash Element (CFE). In certain embodiments, the SSCBs for all the strides may be stored in an SSCB table 308 stored in the secondary cache 300 as shown, or elsewhere.

Similarly, the primary cache 218 may also store metadata 304a associated with the secondary cache 300. For example, the primary cache 218 may store a secondary cache index table (SCIT) 308 that provides a directory for tracks in the secondary cache 300. In certain embodiments, the SCIT 308 is essentially a hash table with a constant hash function. To locate a specific track in the SCIT 308, the hash function may convert a track identifier (e.g., a track number) to a hash value. This hash value may then be looked up in the SCIT 308 to find the STCB for the track. Alternatively, the SCIT 308 could be incorporated into a cache directory of the primary cache 218, thereby providing a single hash table that stores tracks for both the primary and secondary caches 218, 300. In selected embodiments, the SCIT 308 is kept exclusively in the primary cache 218. The SCIT 308 may be built or rebuilt (in the event of a failover, failback, or initial microcode load (IML)) by reading the STCB table 306 in the secondary cache 300.

In certain embodiments, the primary cache 218 may also store a list of free tracks (LOFT) 310 that indicates which tracks in the secondary cache 300 are free (i.e., unoccupied). This list 310 may be used to locate free space in the secondary cache 300 in order to destage data from the primary cache 218 to the secondary cache 300. In selected embodiments, inserting or removing tracks from the LOFT 310 may be performed in a log-structured manner. For example, tracks may be inserted at the end of the LOFT 310 and deleted from the front of the LOFT 310. The LOFT 310 may be kept exclusively in the primary cache 218 and may be built or rebuilt by reading the STCB table 306 in the secondary cache 300.

The primary cache 218 may also store a sorted tree of tracks (STOT) 312 that sorts the tracks by "trackid" or some other indicator. The STOT 312 may be used to minimize seek time (on the disk drives 204) when destaging tracks from the secondary cache 300 to the disk drives 204. The STOT 312 may be kept exclusively in the primary cache 218 and may be built or rebuilt by reading the STCB table 306 in the secondary cache 300.

The primary cache 218 may also store statistics per stride (STATS) 314 for each stride having one or more tracks in the secondary cache 300. A "stride' refers to a set of logically sequential data that might be segmented across multiple disks combined with additional parity information as is for example used in a RAID-5 (redundant array of inexpensive disks) configuration. In general, the STATS 314 may be used to determine which tracks require the least number of disk operations ("disk ops") to destage from the secondary cache 300 to the disk drives 204. In general, the destage penalty for a track will be less where more tracks are present in a stride. When selecting tracks to destage, tracks requiring the least number of disk ops may be destaged first to minimize resource utilization. In selected embodiments, the STATS 314 may store information such as the number of tracks that are present in the secondary cache 300 for each stride, and the number of disk ops required to destage a track in a stride. In certain embodiments, the STATS 314 may store a "recency" bit for each stride. The recency bit may be incremented each time an eviction process passes through a stride. The recency bit may be reset each time a track is added to a stride. The recency bit may be used to keep strides in the secondary cache 300 that are actively being written to. The STATS 314 may be kept exclusively in the primary cache 218 and may be built or rebuilt by reading the STCB table 306 in the secondary cache 300.

The metadata 304a, 304b described above may be structured and stored in various different ways and is not limited to the illustrated structure or organization. The metadata 304a, 304b is provided by way of example to show one technique for storing and structuring the metadata 304a, 304b. For example, in certain embodiments, the data and metadata may be stored together in the secondary cache 300 in a circular log-structured array. Other methods for structuring and storing metadata 304a, 304b may be used and are encompassed within the scope of the invention.

As previously mentioned, one advantage of a large secondary cache 300 is that data can be destaged from the secondary cache 300 far less frequently than conventional secondary caches. This may enable more data to accumulate in the secondary cache 300 before it is destaged to the disk drives 204. Accordingly, in selected embodiments, an apparatus and method in accordance with the invention may be configured to wait for full strides of data to accumulate and coalesce in the secondary cache 300 before the data is destaged to the disk drives 204. As explained above, this may minimize the number of disk ops required to destage data from the secondary cache 300 to the disk drives 204, thereby improving overall system performance.

Figure 4:
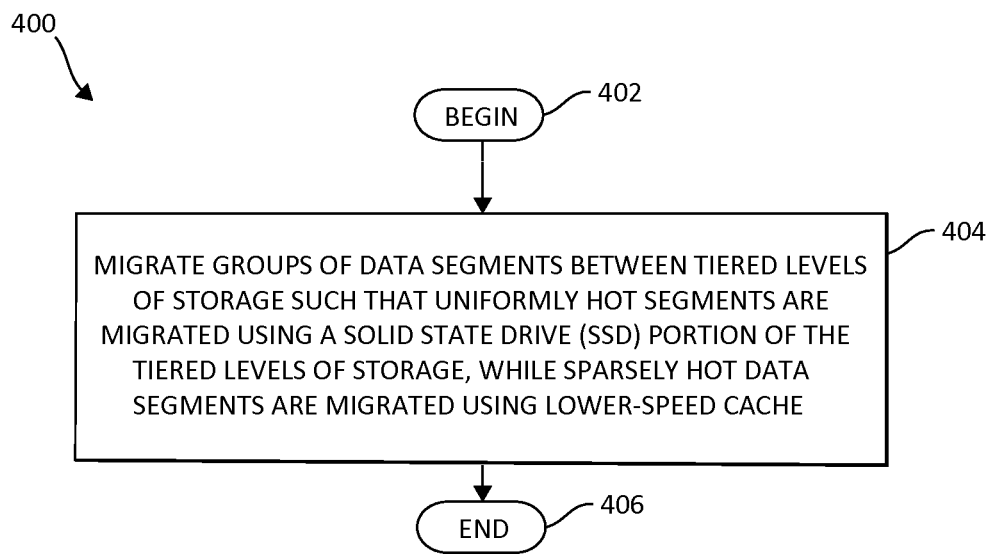
FIG. 4 is a flow chart diagram showing an exemplary method for using different granularity heat maps, in combination with flash cache and tiered storage architectures to improve storage migration performance, in accordance with one embodiment of the present invention.

Referring to FIG. 4, a first exemplary method for migration of data segments using secondary cache (Flash Cache), in a computing environment having dual lower and higher speed levels of cache, and tiered levels of storage, is illustrated. In the illustrated embodiment, the secondary cache is represented as the lower speed level of cache, and the higher speed cache may be implemented in the storage controller as DRAM cache as in a previous exemplary illustration. Method 400 begins (step 402) as a data movement mechanism is initiated. The data movement mechanism is adapted for, implementing Flash Cache (for example, in 1-128 blocks) to perform data copy/migration (for example in 10 MB and 1 GB segments). Flash Cache is implemented to perform data migration/copy functionality since the Flash Cache is physically and logically prioritized higher than other tiered levels of storage and can accommodate all Input/Output (I/O).

To avoid destage conflicts that may result in a DRAM demote to Flash Cache if a data segment (e.g., stride) is being destaged in progress, an out of order migration operation (similar to a RAID rebuild) for Read Miss, and Write (Flash Cache) may be incorporated. Accordingly, in step 404, groups of data segments are migrated between tiered levels of storage such that uniformly hot segments are migrated using a Solid State Drive (SSD) portion of the tiered levels of storage, while sparsely hot data segments are migrated using lower-speed cache (step 404). The method 400 then ends (step 406).

Method 400 may be further enhanced by use of differing granularity heat maps for the determining of which data segments are uniformly hot and which are sparsely hot. For example, in one embodiment, a two-stage consideration may take place, where a selected data segment may be determined to be uniformly hot, for example, by first examining the large granularity (i.e., 1 GB blocks) heat map to determine if the large granularity heat map is hot, and if not, then examining the smaller granularity (such as a stride-by-stride comparison or KB blocks) heat map to determine if a certain number of those granular portions are hotter than a predetermined threshold. For example, in a certain extent, if more than 500 strides in a 1 GB extent are hot, the lower granularity heat map may be said to indicate that the extent is uniformly hot.

In similar fashion, to determine sparse hotness, the larger granularity heat map may first be consulted to determine a hotness above a predetermined threshold, and if not, the smaller granularity heat map may be used to determine if less than the predetermined number of granular portions are hotter than the predetermined threshold.

Figure 5:
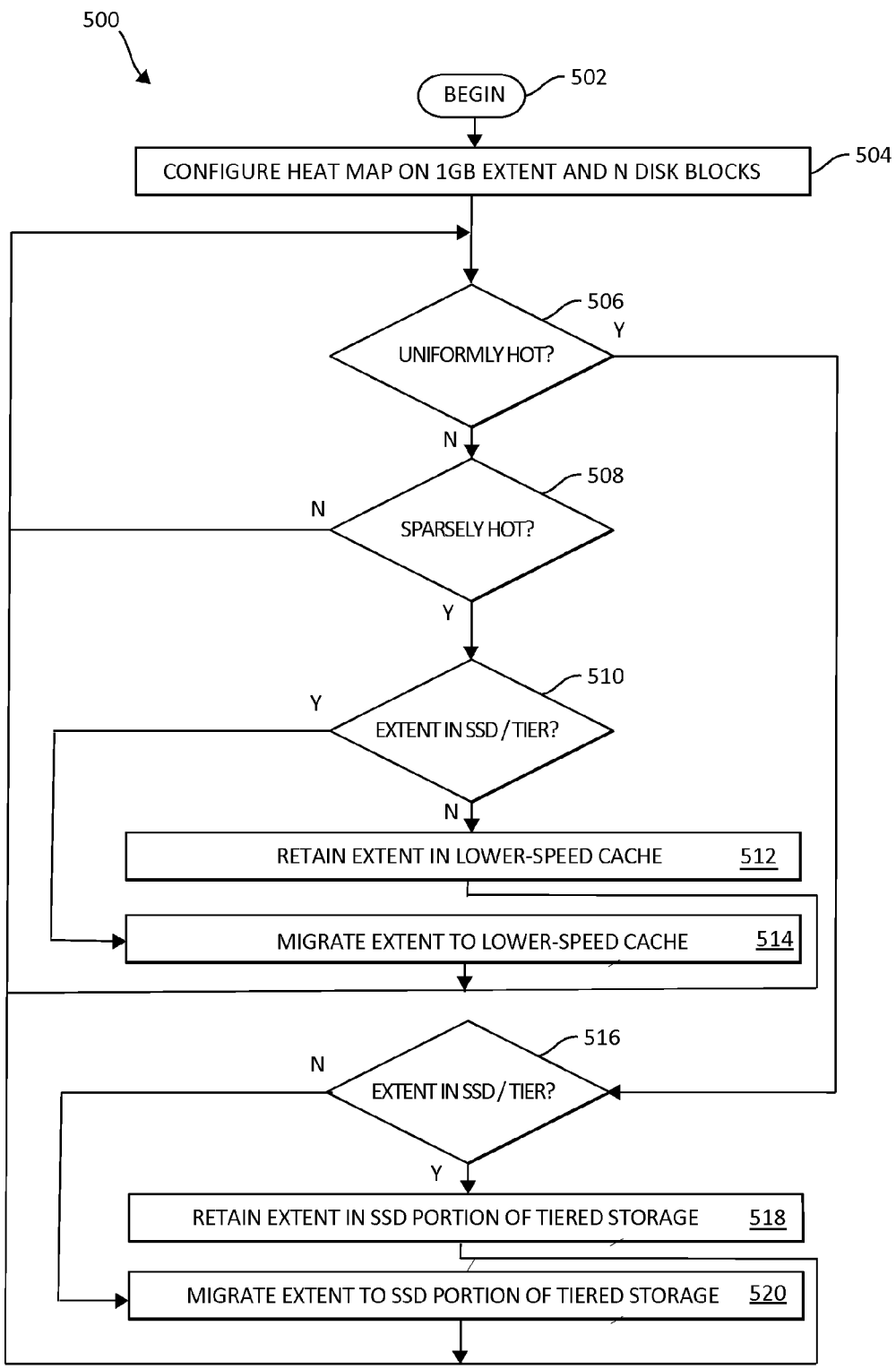
FIG. 5 is a flow chart diagram showing an additional exemplary method for using different granularity heat maps, in combination with flash cache and tiered storage architectures to improve storage migration performance, again in accordance with one embodiment of the present invention.

The determination of uniform hotness and/or sparse hotness can then be used to migrate data between flash cache and tiered storage architectures in accordance with the mechanisms of the present invention as will be further described and shown in FIG. 5, following.

FIG. 5 illustrates an additional exemplary method for data migration in accordance with mechanisms of the illustrated embodiments, taking into account uniform and sparse hotness that, for example, may be determined according to the previous description.

Method 500 begins (step 502) with the configuration of small and large granularity heat maps (step 504). In one embodiment, these heat maps may be configured on 1 GB extents for the larger granularity, and an N number of disk blocks (such as a stride or 1 MB blocks) for the smaller granularity. In step 506, a determination is made as to whether a selected extent is uniformly hot. As previously mentioned, in one embodiment, the extent may be determined to be uniformly hot if the heat map for the larger granularity is hot (i.e., hotter than a predetermined threshold), or/and alternatively, if at least M numbers of the low granularity N disk blocks are hot.

If the extent is determined to be uniformly hot, the method 500 moves to step 516, which queries if the extent is currently cached in the SSD portion of the tiered storage architecture (as opposed to the lower speed, Flash Cache, for example). If not, the entire extent is migrated (step 520) to the SSD portion of the tiered storage architecture, and the method returns to step 506.

Returning to step 516, if the extent is determined to be currently cached in the SSD portion, the extent is retained in the SSD portion (step 518), and the method returns to step 506.

Returning to step 506, if the extent is determined not to be uniformly not, the method 500 moves to step 508, which queries if the extent is sparsely hot. Here again, in one embodiment, the extent may be determined to be sparsely hot if the heat map for the larger granularity is not hot (i.e., not hotter than the predetermined threshold) or/and alternatively, if at least M numbers of the low granularity N disk blocks are not hot.

If the extent is not determined to be sparsely hot in step 508, the method returns to step 506 as shown. If the extent is determined to be sparsely hot, the method moves to step 510, which again queries if the extent is in the SSD portion of the tiered storage architecture (again, as opposed to the lower speed cache). If so, that portion of the extent determined to be sparsely hot is migrated using the SSD portion to the lower-speed cache (step 514), and the entire extent (or alternatively, in another embodiment, that portion of the extent not deemed to be sparsely hot) is migrated from SSD to HDD. The method 500 then returns to step 506 to query against another extent (or perhaps the same extent has now subsequently become uniformly hot). Returning to step 510, if the extent is determined to be currently cached in the SSD portion so, the extent is retained in the SSD portion (step 512), and the method returns to step 506.

As one of ordinary skill in the art will appreciate, various steps in method 500 may be tailored to suit a particular application. In any event, certain data segments may be passed back and forth between the tiered storage and Flash Cache (the lower-speed cache) by for example, once a determination is made that a selected data segment currently in Flash Cache has become uniformly hot, migrating the entire segment to SSD, while not turning the Flash Cache off until the extent is migrated, or once a determination is made that a selected data segment currently in Flash Cache has become sparsely hot, migrating those portions of the segments determined to be sparsely hot to the SSD portion of the tiered storage architecture.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that may contain, or store a program for use by or in connection with an instruction execution system, apparatus, or device.

Program code embodied on a computer readable medium may be transmitted using any appropriate medium, including but not limited to wireless, wired, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that may direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagram in the above figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, may be implemented by special purpose hardware-based systems that perform the specified functions or acts, or combinations of special purpose hardware and computer instructions.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A method for data processing in a computing storage environment by a processor device, the computing storage environment incorporating at least high-speed and lower-speed caches, and tiered levels of storage, the method comprising:

migrating groups of data segments between the tiered levels of storage such that uniformly hot ones of the groups of data segments are migrated to utilize a Solid State Drive (SSD) portion of the tiered levels of storage, while sparsely hot ones of the groups of data segments are migrated to utilize the lower-speed cache;

wherein if a selected group is cached in the lower-speed cache and is determined to become uniformly hot, migrating the selected group from the lower-speed cache to the SSD portion while refraining from processing data retained in the lower-speed cache until the selected group is fully migrated to the SSD portion.

2. The method of claim 1, further including determining the uniformly hot groups of data segments.

3. The method of claim 2, further including determining the uniformly hot groups of data segments by determining that a heat map for a selected one of the group of the data segments is hotter than a predetermined threshold.

4. The method of claim 3, further including determining the uniformly hot groups of data segments by performing at least one of determining that a heat map for a selected one of the group of data segments is hotter than a predetermined threshold, and determining that at least a predetermined number of granular portions of the selected one of the group of data segments is hotter than the predetermined threshold.

5. The method of claim 1, further including determining the sparsely hot groups of data segments.

6. The method of claim 5, further including determining the sparsely hot groups of data segments by performing at least one of determining that a heat map for a selected one of the group of data segments is less hot than a predetermined threshold, and determining that at least a predetermined number of granular portions of the selected one of the group of data segments is less hot than the predetermined threshold.

7. The method of claim 1, further including migrating a selected one of the groups of data segments between the SSD portion and the lower-speed cache by:

if the selected group is cached in the SSD portion and is determined to become sparsely hot, migrating the selected group from the SSD portion to the lower-speed cache, and subsequently, migrating the selected group from the SSD portion to a Hard Disk Device (HDD).

* * * * *